July 19, 1966 R. F. SCHWARZ ETAL 3,261,984

TUNNEL-EMISSION AMPLIFYING DEVICE AND CIRCUIT THEREFOR

Filed March 10, 1961

INVENTORS
RUTH F. SCHWARZ
JAMES P. SPRATT

BY Albert L. Free

AGENT

United States Patent Office 3,261,984
Patented July 19, 1966

3,261,984

TUNNEL-EMISSION AMPLIFYING DEVICE AND CIRCUIT THEREFOR

Ruth F. Schwarz, Abington, and James P. Spratt, Yeadon, Pa., assignors, by mesne assignments, to Philco Corporation, Philadelphia, Pa., a corporation of Delaware Filed Mar. 10, 1961, Ser. No. 94,902
5 Claims. (Cl. 307—88.5)

This invention relates to electrical signal-translating devices and apparatus and to methods for the manufacture thereof. More particularly it relates to solid-state amplifiers and their fabrication.

A variety of devices have been developed in the prior art in which signal translation, including signal amplification and other electronic signal processing, occurs by virtue of electrical operations taking place within solid materials. Chief among these are conventional transistors such as point contact and junction transistors utilizing the injection and collection of minority carriers in semiconductive materials, and the less successful monopolar devices such as the analog transistor for example. While these devices have been satisfactory for many purposes, each has characteristic limitations in respect of high-frequency operation, power-handling capabilities, amplification, resistance to damage by nuclear radiations, mechanical and electrical stability, and ease, economy and reproducibility in fabrication.

It is an object of our invention to provide a novel solid-state signal-translating device.

Another object is to provide a novel solid-state device capable of producing power amplification of signals.

A further object is to provide such a device which is capable of amplifying at high frequencies.

It is another object to provide a new solid-state amplifying device which can be made easily, economically and reproducibly and which is mechanically and electrically stable.

Another object is to provide such a device which is adapted for high-power operation.

Still another object is to provide a novel solid-state amplifying device which is especially resistant to damage by nuclear radiations.

A further object is to provide a novel method for the fabrication of a solid-state signal-translating device.

In accordance with the invention the above objects are achieved by the provision of a device comprising a body of semiconductive material containing a potential barrier of predetermined-barrier height $\phi_c$ at or beneath a surface thereof, a layer of conductive material on said surface, a thin non-metallic film disposed upon said layer of conductive material, and a conductive contact to said non-metallic film on the face thereof opposite said layer of conductive material. External connections may be provided to the portion of the semiconductive body on the opposite side of said barrier from the layer of conductive material, to the latter layer and to said conductive contact. The non-metallic film is sufficiently thin that it can support a voltage applied across it which is large enough to produce a substantial current of charge carriers through the film by the physical phenomenon known as quantum-mechanical tunnelling, and which is large enough to cause such tunnelling carriers to pass through the adjacent layer of conductive material and to reach the potential barrier in the semiconductive body with an energy greater than the height $\phi_c$ of the potential barrier.

To operate the device as an amplifier a bias voltage is applied between the conductive contact on one side and the layer of conductive material on the other side of the non-metallic film so that a tunnel current of charge carriers flows through the film from the conductive contact to the layer of conductive material. In so flowing, the charge carriers acquire energies which exceed the Fermi level energy of such carriers in the layer of conductive material by approximately $q$ times the applied voltage, where $q$ is the electronic charge. This added energy is sufficient that the high-energy carriers can travel through the layer of conductive material to the potential barrier in the semiconductor. The latter barrier is reverse-biased by a voltage applied between the layer of conductive material and the conductive connection to the semiconductor. The current across the reverse-biased barrier consists of the high-energy carriers from the non-metallic film which have energies greater than the barrier height $\phi_c$.

Accordingly the non-metallic film serves as an emitter barrier, the conductive contact thereto as an emitter contact and the external connection to said contact as an emitter electrode; the layer of conductive material serves as a base and the external connection thereto as a base electrode; and the potential barrier serves as a collector barrier, the semiconductor beyond the barrier serves as a collector region in which the carriers are collected, and the external connection to the semiconductor serves as a collector electrode.

In our device the internal impedance between emitter electrode and base electrode during emission is much smaller than the impedance between base electrode and collector electrode, and, since most of the current which flows between the emitter contact and the base also flows between the base and the collector electrode, the difference in emitter and collector impedances provides power gain in the device. This gain may be realized by connecting a load impedance in series with the collector electrode and applying an input signal voltage between emitter and base electrodes. The output signal power thereby developed across the load impedance then exceeds the input signal power. The device can be connected in common-emitter, common-base or common collector circuit configurations analogous to those used with conventional transistors to provide the amplifying operation best suited to the particular application.

In a preferred embodiment of the invention our novel device comprises a wafer of N-type germanium on one face of which a thin layer of a metal such as aluminum of the order of 200 angstroms in thickness is evaporated so as to form a surface barrier in the wafer immediately under the aluminum layer. This barrier serves as the collector barrier and the metal layer serves as the base. The exterior of the metal layer is then oxidized, as by exposing it to air, to form a layer of insulating oxide a few molecular diameters in thickness which serves as the emitter barrier.

The emitter contact is a metal which may be evaporated onto the exterior of the oxide film. Emitter, collector and base electrodes may be applied by simple evaporation and/or soldering techniques. The entire device may then be mounted and packaged in accordance with known transistor techniques.

The resultant device is capable of superior high-frequency operation, especially when operated at high current densities. The frequency-limiting effect of the finite time of transport of carriers from emitter to collector is negligible because the carriers move from the emitter contact to the collector barrier at very high velocities compared with the slow diffusion process relied on in conventional transistors, and because the distance the carriers must travel from emitter contact to collector barrier can be made orders of magnitude smaller than those which are employed in conventional high-frequency transistors. In our novel device the important frequency-limiting parameter of base resistance is also less by orders of magnitude than in an ordinary transistor because the base is a conductor rather than a semiconductor. The remaining principal frequency-limiting parameter is the emitter resistance, and this can be greatly reduced by operating at high current densities or its effect reduced by tuning the emitter capacitance with external circuit elements.

Our novel device is also capable of providing very large amplifications. As the fraction $\alpha$ of emitted carriers which are collected approaches the value one, the power gain produced by the device approaches the ratio of collector resistance to emitter resistance. $\alpha$ can readily be made nearly one because substantially all of the emitted carriers have sufficient energy to reach the collector barrier and the barrier in the semiconductor is low compared to the energy imparted to the carriers by the applied emitter-to-base voltage. Since collector resistances of the order of a million ohms can be provided, and since in our device very low emitter resistances of the order of a few ohms can be achieved, amplifications of the order of a million are possible.

The structure of our device also conduces to operation at relatively high powers. The extremely small spacing of the metal emitter contact from the base and from the collector region where heat is generated in operation makes it possible to remove heat effectively from the device by using an emitter contact and emitter lead of low thermal impedance, and the fact that no active elements are required on the face of the semiconductive body opposite the base layer also facilitates the removal of heat from the semiconductor. Since the device can be made by simple treatments such as evaporation and oxidation performed on one side only of the semi-conductive wafer, it is well adapted for economical mass production. Furthermore since the device does not rely upon the existence of a particular crystalline structure in the base it is also highly resistant to damage by nuclear radiations as compared with transistor devices.

Other objects and features of the invention will be more readily appreciated from a consideration of the following detailed description taken in connection with the accompanying drawings, which are not necessarily to scale, and in which.

Figure 1:
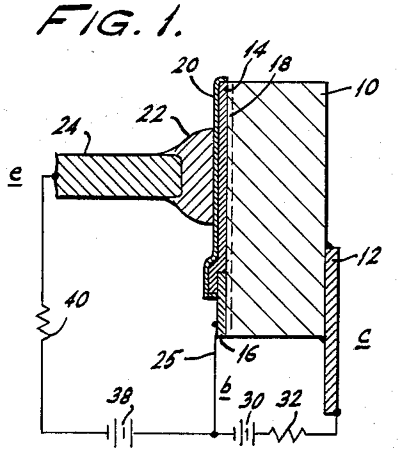
FIGURES 1 and 2 are sectional and plan views, respectively, of a device constructed in accordance with the invention, with operating circuit elements shown schematically thereon.

The invention first will be described in detail with respect to the preferred embodiment thereof illustrated in FIGURES 1 and 2, wherein like elements are indicated by like numerals. In accordance with this specific embodiment of the invention there is employed a crystalline semiconductive wafer 10 which may be of N-type single-crystalline germanium of the general class commonly used in the collector region of a conventional transistor. For example wafer 10 may be approximately 0.075" by 0.175" on each of its major surfaces, approximately 5 mils in thickness, and may have a resistivity of about one ohm-centimeter. Methods for providing such material and for shaping it into an appropriate wafer are well known in the transistor art and hence need not be described in detail.

Affixed to one major surface of the wafer 10 so as to provide ohmic connection thereto is a metal tab 12 of any suitable conductive material such as nickel for example. Tab 12, which constitutes the collector electrode, may be affixed by simple soldering techniques similar to those commonly used in making the base connection to an ordinary transistor.

Beside each other on the face of wafer 10 opposite collector electrode 12 are metal layer 14, which is to serve as the base of the device, and metal layer 16, which constitutes the base electrode for the device. Both layers form surface-barrier contacts with the surface of wafer 10 so as to provide a potential barrier 18 in the wafer 10 immediately beneath the surface thereof, and layer 14 overlaps layer 16 so as to provide low-resistance connection thereto. The metal layer 14 is preferably very thin, for example about 200 angstroms in thickness, while layer 16 may be of the same thickness or may substantially be thicker if desired. Typical materials for layers 14 and 16 are aluminum and gold respectively, but any of a large variety of metals may be used for these purposes. The purpose of the special base electrode 16 in the present case is to facilitate electrical connection to the aluminum base despite the fact that it is difficult to make good electrical connection to aluminum by ordinary methods once exposure to air has formed an oxide on the aluminum. It will be understood that where the base is of a metal which does not oxidize readily the base electrode may be applied by merely soldering a wire directly to the base itself.

Layers 14 and 16 may be provided by vacuum evaporation with appropriate masking. One specific method which has been used to make layers 14 and 16 is as follows. Prior to evaporation the surface of wafer 10 is prepared by etching it for about 5 seconds with an etchant comprising 250 cc. of $HNO_3$, 150 cc. of glacial acetic acid, 150 cc. of Hf and 3 cc. of Br, arresting the etching by pouring deionized pure water into the etchant and then rinsing the wafer in fresh water and drying it. From this point in the process to completion of the device precautions should be taken to maintain utmost cleanliness. The structure is then placed in a chamber evacuated to a pressure of about $10^{-5}$ mm. of mercury and the gold base electrode layer 16 evaporated onto a part of the wafer in the position shown by conventional evaporation and masking techniques. The time interval during which the gold is deposited may be controlled by a shutter arranged to expose the wafer to the source of evaporating gold for ⅕ second upon each actuation of the shutter. The rate of deposition is typically about 1000 angstroms of gold per second, and exposure of the wafer for ⅕ second therefore produces a base connection about 200 angstroms thick. Next the remainder of the same surface of wafer 10 and a part of the gold layer is exposed in a similar manner to evaporation of aluminum to form the layer 14 of about 200 angstroms thickness.

While in this specific example rapid evaporation is used it will be understood that where the possibility of oxidation or other contamination is eliminated by using higher vacuums, slower rates of deposition are also practical.

On the exterior side of the aluminum base layer 14 is an extremely thin film 20 of a non-metallic material such as an oxide which is an electrical insulator in bulk form, which film serves as the emitter barrier. In the present example it may consist of a layer of aluminum oxide about 20 angstroms thick formed by admitting dry, clean air into the evaporation chamber and allowing the air to contact the aluminum base layer for one to two hours at room temperature (25° C.). The thickness of oxide thus formed depends primarily upon the temperature during formation, and growth of the oxide is self-terminating and hence not critically dependent upon time so long as a predetermined minimum time is allowed for growth. Typical relations of such oxide thickness to temperature are described in an article beginning at page 482 of "The Journal of the Electrochemical Society" for September 1956.

On the exterior of the oxide film is an emitter contact 22, in this case in the form of a strip, which may be of gold or other suitable conductive material. This contact may be made as thick as is desired for convenience in fabrication and in attaching the metal emitter electrode 24 thereto, and may be formed by vacuum evaporation similar to that described hereinbefore. An external connection 25 which may be a metal wire is connected to the base contact 16 as by pressure contact, soldering or conductive paste.

In operating the device the electrodes 24, 16 and 12 are used in a manner generally analogous to the use of the emitter, base and collector electrodes respectively of a conventional transistor. Thus a bias voltage is applied between collector electrode 12 and base electrode 16 so as to reverse bias the potential barrier 18 in the semiconductive wafer 10. In the present example this may be accomplished by connecting the battery 30 between electrodes 16 and 12 so as to make the collector electrode 12 positive with respect to the base electrode 16 and to operate it in its high-resistance condition. A collector bias of 1 volt is typical. A suitable load resistor 32 may be included in series between base and collector electrodes as shown. To operate the emitter, the emitter electrode 24 is biased negative with respect to the base electrode 16, as by the battery 38, and a current-limiting resistor 40 may be included in the path of emitter current. A typical bias for the emitter electrode is 3 volts negative with respect to the base electrode.

As will also be explained more fully hereinafter, when the appropriate biases are applied as shown, electrons from the emitter contact 22 pass through the thin insulator film 20 with high energies due to the voltage applied between emitter and base electrodes, these energies being sufficient for the electrons to traverse the thin metal film 14, to reach the barrier 18 and to enter the portion of the semiconductive wafer 10 beyond the barrier, where they are collected. When the fraction of the emitted higher-energy electrons collected by the collector is sufficiently close to one, the existence of a relatively low impedance in the device between the emitter and base electrodes and a relatively high impedance in the device between the base and collector electrodes makes possible useful power amplification. For example a signal applied between emitter and base electrodes 24 and 16 will appear in amplified form across the collector load resistor 32. As mentioned previously the device may be operated in either a grounded-emitter or grounded-base connection in a manner generally analogous to the circuit operation of a transistor.

Figure 2:
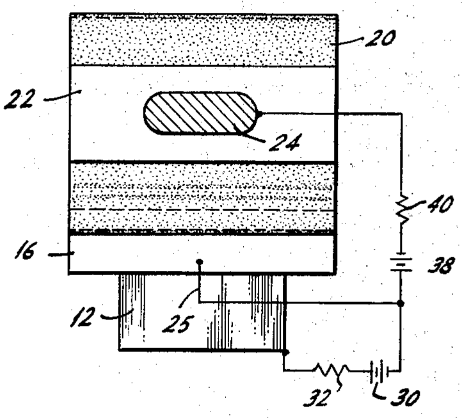
Figures 3A, 3B, 3C:
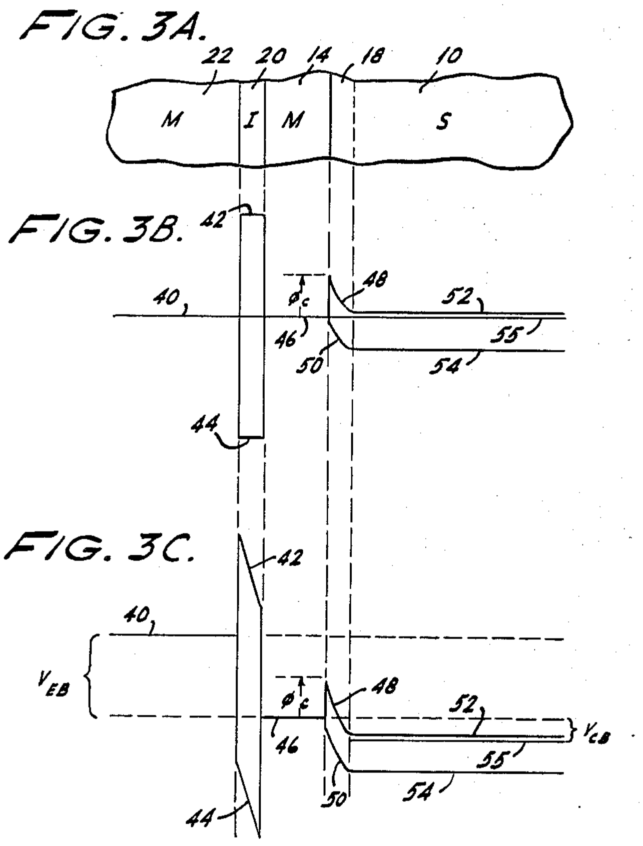
FIGURE 3A is a diagram of a portion of a section through a device of the type shown in FIGURE 1.
FIGURES 3B and 3C are graphical representations with respect to which the principle of the invention will be explained.

The significance of the various dimensions and characteristics of the elements of the device of FIGURES 1 and 2 will be more readily understood from a consideration of the following description of the principles of operation of the device. Referring to FIGURES 3A, 3B and 3C, FIGURE 3A illustrates the successive regions of metal, insulator, metal and semiconductor encountered by an electron in travelling from emitter contact 22 through insulator film 20, metal layer 14 and the region containing potential barrier 18 to the bulk of the semiconductive wafer 10 of the device of FIGURES 1 and 2. FIGURE 3B is a graph in which ordinates represent electron energies in the several regions shown in FIGURE 3A when no external voltages are applied, while FIGURE 3C is a similar plot for the case in which suitable external operating voltages are applied.

In FIGURE 3B the line segment 40 represents the Fermi level for electrons in the metal emitter contact 22, the line segments 42 and 44 represent the lower edge of the conduction band and the upper edge of the valence band, respectively, of the insulator film 20, and line segment 46 represents the Fermi level for electrons in the metal base layer 14. Line segments 48 and 52 represent the lower edge of the conduction band for the semiconductive wafer 10, while line segments 50 and 54 represent the upper edge of the valance band in the latter body and line segment 55 indicates the Fermi level in the semiconductor. As shown, in the absence of applied voltages the Fermi level is the same in all of the materials. A potential barrier of height $\phi_c$ exists at the interface between the metal base layer 14 and the semiconductive wafer 10.

In FIGURE 3C corresponding line segments are indicated by corresponding numerals for the case in which the emitter contact 22 is made negative with respect to metal base 14 by an externally applied voltage $V_{EB}$ and the collector electrode 12 is made positive with respect to the base 14 by an externally applied voltage $V_{CB}$. When this is done the Fermi level 40 in emitter contact 22 maintains its original relative position with respect to the bottom of the conduction band 42 at the left side of insulator film 20, and the Fermi level 46 in metal base layer 14 maintains its original relative position with respect to the bottom of the conduction band 42 at the right side of insulator film 20 and with respect to the bottom of the conduction band 48 at the interface between base 14 and semiconductor 10. Similarly the Fermi level in the portion of semiconductive wafer 10 to the right of the barrier 18 maintains its original position relative to the conduction and valence band edges 52 and 54. However due to the externally-applied voltages the Fermi level 46 in the metal base 14 is depressed with respect to the Fermi level in the emitter electrode 22 by the amount of the applied voltage $V_{EB}$, while the Fermi level 55 in the bulk of semiconductor wafer 10 is depressed with respect to the Fermi level in the metal base 14 by the amount of the applied collector voltage $V_{CB}$. This relationship of the Fermi levels produced by the applied voltages is made possible by the tilting of the band edges 42, 44 in the insulating film 20 and the band edges 48, 50 in the collector barrier region 18 as shown.

With the operating conditions shown in FIGURE 3C electrons are able to flow from emitter contact 22 to metal base 14 through insulator film 20 by the phenomenon known as quantum-mechanical tunnelling. The existence of the electron-tunnelling effect in thin films has been established in the prior art and it is therefore unnecessary to describe the basic physical phenomenon here in detail. In brief, if the material of insulator film 20 were present in bulk form it would not ordinarily conduct until the voltage across it became so high that breakdown of the material occurred, because there are substantially no free charge carriers available to carry current through such an insulator. However, when the insulator is made thinner so that it becomes a film of the order of 20 angstroms in thickness, electrons near the Fermi level 40 in the emitter contact 22 will pass through the film to the metal base 14 by tunnelling and emerge into the metal base 14 at an energy level substantially the same as the Fermi level in the emitter electrode, as indicated by the dashed extension of line segment 40. The magnitude of this tunnel current increases markedly with decreases in film thickness and with increases in the applied voltage $V_{EB}$. Importantly, we have found that even though the film is extremely thin it can support relatively large voltages applied across it without breaking down because, as its thickness is made less, the electron collisions which normally produce breakdown do not occur to any substantial extent. For example using a film 20 of aluminum oxide about 20 angstroms thick, values of applied voltage $V_{EB}$ of 5 volts have been achieved.

As is illustrated in FIGURE 3C by the dashed extension of line segment 40, the electrons which have tunnelled through the film 20 to the base metal 14 are at an energy level on entering the base which is the same as the Fermi level in contact 22 and which therefore exceeds the Fermi level in the base by the amount of applied voltage $V_{EB}$. This increase in energy manifests itself as an increase in velocity of the electrons in a direction parallel to line segment 40 toward semiconductor 10. In fact the electrons in passing through the film 20 acquire additional kinetic energy equal to the applied voltage $V_{EB}$ multiplied by the electronic charge $q$, as if they had been accelerated in vacuum by a voltage $V_{EB}$.

The metal base 14 is sufficiently thin that most of these high-energy electrons which have tunnelled through the film 20 pass through the base with no appreciable loss in energy. Substantially no loss of energy of the electrons occurs in the base when it has a thickness less than the mean free path of electrons therein. Actually some loss of energy in the base may be tolerated so long as the electrons emerge from the base into the semiconductor with energies in excess of the height $\phi_c$ of the potential barrier 18 in the semiconductor. Such high-energy electrons pass beyond the reversed-biased barrier 18 and are collected in the region of the semiconductor to the right of the barrier.

Where wafer 10 is of germanium the potential barrier 18 in the semiconductor is typically about 0.6 volt in height so that the electrons near the Fermi level in the base 14 cannot pass the barrier to any substantial extent, and only a very small leakage current flows through the reverse-biased collector electrode in the absence of high-energy electrons which have tunnelled through film 20. However the high-energy tunnel electrons readily pass the barrier and are collected as described above. Accordingly the collector current varies with, and is substantially equal to, the emitter current so long as the applied emitter voltage $V_{EB}$ exceeds the collector barrier height $\phi_c$ by an appreciable amount sufficient to accommodate any slight loss in energy suffered by electrons in passing through the metal base 14 and to accommodate the slight spread in the energies of the high-energy electrons which has been found to occur in practice. These conditions are easily met when $V_{EB}$ is about 3 volts, the collector barrier is about 0.6 volt in height and located at the surface of the semiconductor, and the base is a metal such as aluminum about 200 angstroms or less in thickness.

Figure 4:
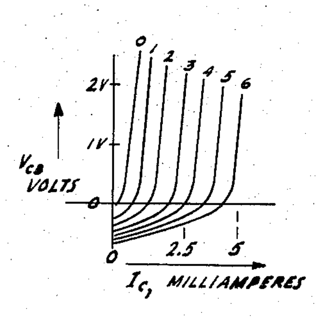
FIGURES 4 and 5 are graphical representations illustrating electrical characteristics of the device of the invention in one of its possible circuit connections.
Figure 5:
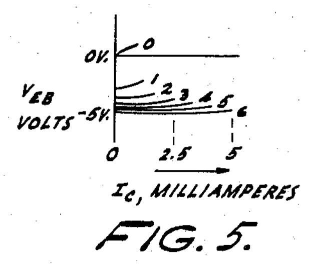

The characteristics of one embodiment of our device at room temperature are shown in FIGURES 4 and 5. In FIGURE 4 ordinates represent collector-to-base voltage $V_{CB}$ in volts and abscissae represent collector current in milliamperes, the curve at the extreme left being obtained for the case of zero emitter current and the other six surves being produced with constant emitter-current values which increase progressively from left to right in 1 milliampere steps. The steep slopes of these curves for positive collector voltages show the desired high collector impedance and their spacings show relatively high alpha and insensitivity of collector current to low-energy electrons. While in the particular device whose characteristics are shown the alpha was about 0.75, alphas of 0.9 have been achieved in other units.

In FIGURE 5 ordinates represent emitter-to-base voltage $V_{EB}$ in volts and abscissae represent collector current in milliamperes, the highest curve being obtained for zero emitter current and each successively lower curve on the graph being obtained for constant emitter-current values increasing progressively in 1 milliampere steps. The small spacings between the lower curves indicate the desired low emitter-to-base impedance.

From the foregoing it will be apparent that the nature, shape and thickness of the emitter electrode 22 are not critical. Some convenient metals for use as the emitter electrode besides gold are gallium, nickel, indium, cesium, lithium and aluminum. The film 20 need not be an oxide so long as it is non-metallic so as to support a sufficiently high voltage $V_{EB}$ when thin enough for substantial tunnelling to occur. When the film is an oxide we prefer to form it by the method of thermal growth because of the uniformity of the films obtained both as to thickness and composition, but it is possible to use other methods such as anodic oxidation to form the oxide film. Other compound films, such as nitrides of the base metal for example, may also be used, and so long as the film is adherent and will support the required voltage $V_{EB}$ it need not even be a compound of the under lying metal but may be an entirely different substance such as an oxide of another metal or even an inorganic film.

The base 14 can be of any of a variety of conductive materials besides aluminum, such as silver, copper, titanium, or tantalum, for example, so long as it can be made sufficiently thin to permit the high-energy tunnel electrons to pass through it without reducing their energies below those required to surmount the collector barrier 18. Furthermore the semiconductor employed as the collector need not be germanium, so long as a barrier of appropriate height less than $V_{EB}$ can be formed in it in a region which the emitted electrons can reach with sufficient energy to surmount the barrier. For example silicon or intermetallic semiconductors may also be used.

In the specific embodiment of the invention described thus far the base 14 has been described as preferably constituting a conductive layer forming a surface-barrier contact with the semiconductor. This arrangement has the advantages that there is no material between base and collector barrier to reduce the energy of emitted electrons travelling to the barrier and that a minimum number of fabricating steps are required since the application of the base also forms the collector barrier. However the collector barrier may be formed in other appropriate ways, bearing in mind the requirements for operation described hereinbefore. One particularly useful alternative is to form a region of altered conductivity characteristics at or under the surface of the semiconductor as by diffusion, micro-alloying or epitaxial growth. Where the semiconductor is N-type a thin surface layer thereof may be made P-type, or at least substantially less strongly N-type, in which case the potential barrier is not critically dependent upon surface states at the interface between metal and semiconductor and the stability and reproducibility of the device are therefore enhanced. The desired surface layer of altered conductivity may be produced prior to application of the base by diffusing or micro-alloying a P-type dopant slightly into the surface, or may be produced by using as the base a material which is a P-type dopant and diffusing or micro-alloying the base material partially into the semiconductor upon or after application of the base material. Suitable metals for this purpose are aluminum, gallium or indium as examples.

Similarly the form of the device may depart widely from that specifically described, as may the details of fabricating the various layers and connection. For example the device may be of circular form, with a ring-shaped base electrode, or it may be made with small active areas, both of which measures contribute to improved high-frequency amplification.

While the invention has been described with particular reference to specific embodiments thereof it may be embodied in any of a large variety of differing form without departing from the scope of the invention as defined by the appended claims.

We claim:

1. Signal-translating apparatus comprising:

a body of N-type semiconductive material, a metal film on a surface of said body, said film forming a surface-barrier connection to said surface, said surface barrier having a height $\phi_c$ in electron-volts, a non-metallic film on a surface of said metal film remote from and opposite said body, a conductive connection to a surface of said non-metallic film remote from and opposite said metallic film, said non-metallic film being sufficiently thin to support across it a voltage greater than $\phi_c/q$ where $q$ is the charge of an electron, and to pass a substantial tunnel current of high-energy electrons from said conductive connection to said metal film in response to said voltage, means for applying between said conductive connection and said metal film a voltage poling said conductive connection negative with respect to said film and having a value greater than $\phi_c/q$, thereby to cause said non-metallic film to pass a substantial tunnel current of high-energy electrons, and means for applying between said metal film and said body a voltage poling said body positive with respect to said metal film, thereby to reverse-bias said surface-barrier connection, said metal film being sufficiently thin to permit a substantial number of said high-energy electrons to pass through said metal film and past said reverse-biased surface-barrier connection.

2. Apparatus according to claim 1, wherein said non-metallic film is an oxide of said metal of said film.

3. Apparatus according to claim 1, wherein said non-metallic film is of the order of 20 angstroms in thickness and said metal film is of the order of 200 angstroms in thickness.

4. Apparatus according to claim 1, wherein said semiconductive material is monocrystalline N-type germanium, said metal film is composed of aluminum, said non-metallic film is composed of aluminum oxide, and said conductive connection comprises a metal connection of said non-metallic film.

5. Apparatus according to claim 4, wherein said non-metallic film is of the order of 20 angstroms in thickness and said metal film is of the order of 200 angstroms in thickness.

References Cited by the Examiner

UNITED STATES PATENTS

| | | | |
|---|---|---|---|
| 2,791,759 | 5/1957 | Brown | 317—235 X |
| 2,845,375 | 7/1958 | Gobat et al. | 148—1.5 |
| 2,953,693 | 9/1960 | Philips | 307—88.5 |
| 2,979,427 | 4/1961 | Shockley | 148—1.5 |
| 2,980,809 | 4/1961 | Teszner | 307—88.5 |
| 3,040,266 | 6/1962 | Forman | 317—235 X |
| 3,047,423 | 7/1962 | Eggenberger | 117—107 |
| 3,056,073 | 9/1962 | Mead | 317—235 |
| 3,060,327 | 10/1962 | Dacey | 317—235 |
| 3,097,308 | 7/1963 | Wallmark | 317—235 X |
| 3,106,489 | 10/1963 | Lepselter | 317—235 |
| 3,121,177 | 2/1964 | Davis | 317—234 |

DAVID J. GALVIN, *Primary Examiner.*

BENNETT G. MILLER, *Examiner.*

W. K. TAYLOR, C. E. PUGH, *Assistant Examiners.*